US011885040B2

(12) United States Patent
Kim et al.

(10) Patent No.: US 11,885,040 B2
(45) Date of Patent: *Jan. 30, 2024

(54) SINGLE CRYSTAL EPITAXIAL LAYER HAVING A RHOMBOHEDRAL LATTICE

(71) Applicant: UNITED STATES OF AMERICA AS REPRESENTED BY THE ADMINISTRATOR OF NASA, Washington, DC (US)

(72) Inventors: Hyun Jung Kim, Poquoson, VA (US); Sang Hyouk Choi, Poquoson, VA (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/115,101

(22) Filed: Dec. 8, 2020

(65) Prior Publication Data
US 2021/0123158 A1  Apr. 29, 2021

Related U.S. Application Data

(62) Division of application No. 15/358,987, filed on Nov. 22, 2016, now Pat. No. 10,858,754.
(Continued)

(51) Int. Cl.
C30B 29/52 (2006.01)
C30B 23/08 (2006.01)
(Continued)

(52) U.S. Cl.
CPC ............ C30B 23/08 (2013.01); C30B 23/066 (2013.01); C30B 29/52 (2013.01);
(Continued)

(58) Field of Classification Search
CPC ....... C30B 23/00; C30B 23/02; C30B 23/025; C30B 23/06; C30B 23/063; C30B 23/066;
(Continued)

(56) References Cited

U.S. PATENT DOCUMENTS 3,799,862 A  3/1974 Krutenat
7,341,883 B2  3/2008 Park
(Continued)

OTHER PUBLICATIONS

Park, et al. publication entitled "Rhombohedral epitaxy of cubic SiGe on trigonal c-plane sapphire," Journal of Crystal Growth, vol. 310, pp. 2724-2731 (2008). (Year: 2008).*
(Continued)

Primary Examiner — Kenneth A Bratland, Jr.
(74) Attorney, Agent, or Firm — Matthew R. Osenga; Jennifer L. Riley; Trent J. Roche

(57) ABSTRACT

Some aspects relate to methods of forming an epitaxial layer. In some examples, the methods include ejecting atoms from a molten metal sputtering material onto a heated crystalline substrate and growing a single epitaxial layer on the substrate from the ejected atoms, where the atoms are ejected with sufficient energy that the grown epitaxial layer has at least a partial rhombohedral lattice, and wherein the crystalline substrate is heated to a temperature of about 600 degrees Celsius or less, or about 500 degrees or less. Other aspects relate to materials, such as a material including a single epitaxial layer on top of a crystalline substrate, the layer including one or more semiconductor materials and having at least a partial rhombohedral lattice, or a substantially rhombohedral lattice.

16 Claims, 8 Drawing Sheets

Related U.S. Application Data

(60) Provisional application No. 62/259,692, filed on Nov. 25, 2015.

(51) Int. Cl.
  *C30B 23/06* (2006.01)
  *H01L 21/02* (2006.01)

(52) U.S. Cl.
  CPC .... *H01L 21/0242* (2013.01); *H01L 21/02433* (2013.01); *H01L 21/02532* (2013.01); *H01L 21/02609* (2013.01); *H01L 21/02631* (2013.01); *H01L 21/02658* (2013.01)

(58) Field of Classification Search
  CPC ......... C30B 23/08; C30B 29/00; C30B 29/02; C30B 29/06; C30B 29/10; C30B 29/20; C30B 29/52; C30B 30/00; C30B 30/04; H01L 21/0242; H01L 21/02532; H01L 21/0259; H01L 21/02631; H01L 21/02433; H01L 21/02609; H01L 21/02658
  USPC ........... 117/84, 106, 108, 928–929, 935–936
  See application file for complete search history.

(56) References Cited

U.S. PATENT DOCUMENTS

| | | | |
|---|---|---|---|
| 7,906,358 | B2 | 3/2011 | Park |
| 8,226,767 | B2 | 7/2012 | Park |
| 8,257,491 | B2* | 9/2012 | Park ..................... G01N 23/207 117/1 |
| 10,096,472 | B2* | 10/2018 | Choi ..................... H01L 29/161 |
| 2009/0206368 | A1* | 8/2009 | Park ..................... G01N 23/207 204/192.1 |
| 2012/0199952 | A1 | 8/2012 | D'Evelyn et al. |
| 2017/0178903 | A1* | 6/2017 | Choi ..................... C30B 23/08 |

OTHER PUBLICATIONS

H.J. Kim, H.B.Bae, Y. Park, K. Lee, and S.H. Choi, "Temperature dependence of crystalline SiGe growth on sapphire (0001) substrates by sputtering," Journal of Crystal Grow, Aug. 2012, pp. 124-128, vol. 353 (1).

H.J. Kim, Y. Park, H. B. Bae, and S.H. Choi, "High-Electron-Mobility SiGe on Sapphire Substrate for Fast Chipsets," Advances in Condensed Matter Physics, vol. 2015 (2015), Article ID 785415, 9 pages, http://dx.doi.org/10.1155/2015/785415, accessed Nov. 22, 2016.

S. Poulat and F. Ernst, "Epitaxy of Ge on sapphire," Materials Science and Engineering , 2002, pp. 9-16, vol. A323.

W. B. Dubbelday and K. L. Kavanagh, "The growth for SiGe on sapphire using rapid thermal chemical vapor deposition", Journal of Crystal Growth, 2001, pp. 20-28, vol. 222.

Yasunori Taga, "Modification of Thin Film Properties by Sputtered Particles", R&D Review of Toyota CRDL, vol. 28, No. 3 (Sep. 1993).

\* cited by examiner

SINGLE CRYSTAL EPITAXIAL LAYER HAVING A RHOMBOHEDRAL LATTICE

CROSS-REFERENCE TO RELATED PATENT APPLICATION

This patent application is a divisional of and claims benefit of and priority to U.S. Non-Provisional patent application Ser. No. 15/358,987, filed on Nov. 22, 2016, now U.S. Pat. No. 10,858,754, which claims the benefit of and priority to U.S. Provisional Patent Application No. 62/259,692, filed on Nov. 25, 2015, the entire contents of each are hereby incorporated by reference in their entireties.

STATEMENT REGARDING FEDERALLY SPONSORED RESEARCH OR DEVELOPMENT

The invention described herein was made in the performance of work under a NASA contract and by an employee of the United States Government and is subject to the provisions of Public Law 96-517 (35 U.S.C. § 202) and may be manufactured and used by or for the Government for governmental purposes without the payment of any royalties thereon or therefore. In accordance with 35 U.S.C. § 202, the contractor elected not to retain title.

BACKGROUND OF THE INVENTION

In some aspects, this disclosure relates to improved epitaxy methods and systems for forming epitaxial films or layers on top of a substrate, such as those for forming rhombohedral layers on crystalline substrates.

The alloys of group IV elements (group 14 under the IUPAC naming scheme), including carbon (C), silicon (Si), germanium (Ge), and tin (Sn) are important semiconductor materials. For example, SiGe alloy is widely used in Hetero Bipolar Transistor and High Electron Mobility transistor for high-speed computing and wireless communications as well as in thermoelectric materials. The epitaxial growth of these alloys has been very difficult, however, because the alloy has a different lattice constant from that of the commonly used substrates, such as silicon or sapphire wafers. Thus, the thickness of the grown layers has been very thin and such layers often have a high density of defects such as misfit dislocations.

Atomic surface structure is dictated by the need for the surface atoms to bond to one another to lower overall system energy. As incoming atoms attach to the surface, the surface structure determines how and where the attaching atoms sit. Traditionally, the substrate temperature ratio of constituent fluxes, and the absolute deposition rate are the controlling parameters in epitaxial film growth. Most epitaxial growth methods are limited in controlling the flux.

Prior efforts in rhombohedral band gap engineering, as to single crystal growth of epitaxy materials, require a certain amount of energy that triggers a deformation process to alter the shape of, e.g., cubic and zinc-blende structure into rhombohedron. The thermal energy manipulation of these deformation processes is crucial for a successful formation of rhombohedral structure.

For example, most prior epitaxy processes in semiconductor device processing lines have only used an electrically resistive heating element to elevate substrate temperature to a desired level, such as 1100 degrees Celsius for SiGe. Thermal soaking of substrate heating at an elevated temperature for long periods has mainly served two purposes by enabling the substrate to undergo (1) restructuring of the sapphire substrate to be either an oxide- or aluminum-terminated structure and (2) reserving a sufficient energy for shape change of cubic or zinc-blende structure into a rhombohedron. Restructuring the sapphire substrate to be either an oxide- or aluminum-terminated structure, as mentioned above with respect to point (1), was not a fully proven conclusion, but regarded as a likely hypothesis. The two triagonal structures of sapphire are arranged with 180° rotated position on each other. Therefore, these triagonals appear to be hexagonal from the top view. Also, one triagonal is positioned at an upper position and the other is recessed at a lower position with a certain gap between them. By thermal soaking, there are the changes not only in the lattice constant of sapphire, but also in the gap distance of upper and lower triagonals. However, the thermal soaking process is costly and requires a large overhead for high yield production. The high temperature process of sapphire substrate for providing lattice formation energy also requires a long time period of thermal soaking of the substrate, e.g. on the order of hours. Thus, the requirements of high thermal soak include the cost of high-energy consumption but still provide a relatively low yielding preparation. In other prior efforts, a high temperature about 890 degrees Celsius is essential for growing, for example, the single crystal $Si_{1-x}Ge_x$ on sapphire substrate to deform the shape of cubic or zinc-blende structure into rhombohderon.

However, the control, stabilization, and equilibrium condition of temperature with radiative heating of any epitaxy process is unacceptable for the high yield requirement of wafer production. Additionally, the alteration process of the lattices of cubic or zinc-blende structures (e.g. SiGe) by the energy transferred from sapphire in thermal soak takes an unusually long time (e.g. over two hours) and is therefore not appropriate for mass production. Thus, new systems and growth procedures for rhombohedrally epitaxial growth are needed.

BRIEF SUMMARY OF THE INVENTION

This Brief Summary of the Invention provides an introduction to some general concepts relating to this disclosure in a simplified form, where the general concepts are further described below in the Detailed Description of the Invention. This Brief Summary of the Invention is not intended to identify key features or essential features of the disclosure.

In some aspects, this disclosure relates to methods of, inter alia, growing epitaxial layers. These methods may avoid the large amounts of time required in conventional epitaxy processes, as well as thermal soaking at a high temperature that consumes large amounts of energy in conventional processes.

For example, in one embodiment, the method includes ejecting atoms from a molten metal sputtering material onto a heated crystalline substrate, and growing a single epitaxial layer on the substrate by the ejected atoms. In some embodiments, the atoms are ejected with sufficient energy that can be used for the formation of rhombohedral lattice structure in the epitaxial layer. In certain examples, the crystalline substrate is heated to a temperature of about 800 degrees Celsius or less, about 600 degrees or less, or about 500 degrees Celsius or less.

In various embodiments, the crystalline substrate is heated to a temperature of about 500 degrees Celsius or less. In some embodiments, about 99% or more of the grown epitaxial layer has a rhombohedral lattice, and in various embodiments, about 99.7% or more has a rhombohedral lattice. In some examples, the grown epitaxial layer has a thickness that is about 10 or more micrometers, while in various embodiments the thickness is about 100 or more micrometers.

In certain embodiments, the ejected atoms include one or more of Silicon (Si), Germanium (Ge), Carbon (C), and Tin (Sn). In some examples, the crystalline substrate includes a sapphire material or one or more other materials with triagonal lattice structures. In certain examples, about 70% or more of the atoms of the grown epitaxial layer are Germanium, while in others about 85% or more are Germanium. In various examples, substantially all of the remaining atoms are Silicon. In some examples, the remaining atoms are more than about 95% Silicon atoms, more than 98% Silicon atoms, more than about 99% Silicon atoms, or more than about 99.9% Silicon atoms.

In some examples of the method, the atoms are ejected using ionized evaporation. In various embodiments, the atoms are ejected from a surface of a molten magnetron target.

In another aspect, the disclosure relates to materials. For example, in some embodiments, the material includes a single crystal epitaxial layer on top of a crystalline substrate, where the layer includes one or more semiconductor materials and has a substantially rhombohedral lattice. In some embodiments, the layer of one or more semiconductor materials has a rhombohedral lattice. In some examples, the one or more semiconductor materials includes one or more of Silicon, Germanium, Carbon, and Tin. In various embodiments, the crystalline substrate includes a sapphire material.

In certain examples, about 99% or more of the single epitaxial layer has a rhombohedral lattice. In some examples, more than 99% of the rhombohedral lattice has the same relative orientation. In some examples, the single crystal epitaxial layer has a thickness that is about 10 or more micrometers. In certain examples, it is about 100 or more micrometers.

In some examples of the material, about 70% or more of the atoms of the single epitaxial layer are Germanium, and substantially all of the remaining atoms are Silicon. In various embodiments, about 85% or more of the atoms of the single epitaxial layer are Germanium, and substantially all of the remaining atoms are Silicon.

These and other features, advantages, and objects of the present disclosure will be further understood and appreciated by those skilled in the art by reference to the following specification, claims, and appended drawings.

BRIEF DESCRIPTION OF THE SEVERAL VIEWS OF THE DRAWINGS

Example embodiments of the disclosure will now be described by way of example only and with reference to the accompanying drawings, in which.

DETAILED DESCRIPTION OF THE INVENTION

Figure 1:
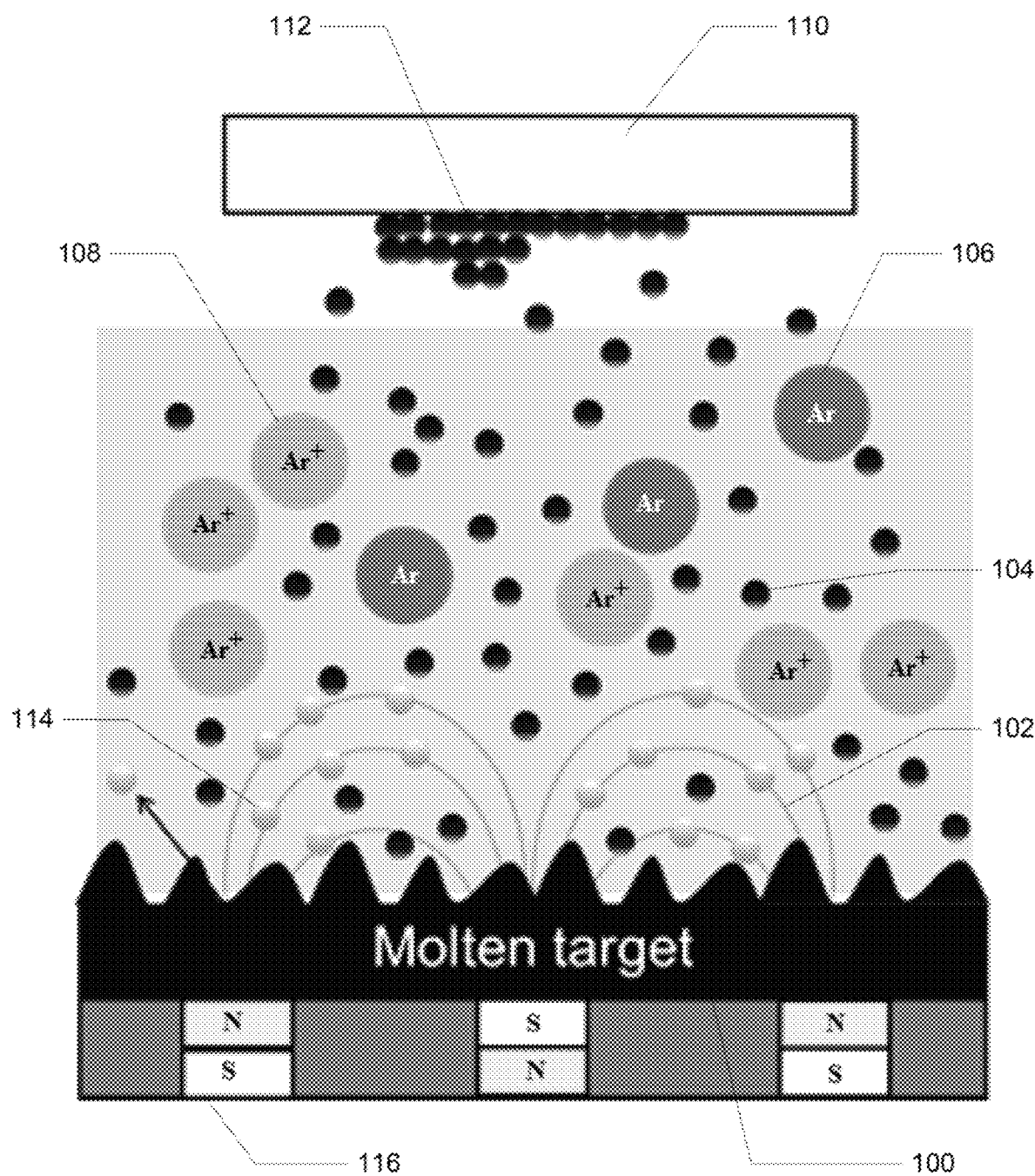
FIG. 1 illustrates a schematic of a system for an indirect-cooled gun design for a molten target sputtering ("MTS") deposition.

For purposes of description herein, the terms "upper," "lower," "right," "left," "rear," "front," "vertical," "horizontal," and derivatives thereof shall relate to the invention as oriented in FIG. 1. However, it is to be understood that the invention may assume various alternative orientations and step sequences, except where expressly specified to the contrary. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

The examples, materials and methods as described herein provide, inter alia, methods and systems for growing epitaxial layers, or materials or systems incorporating such layers (e.g. solar cells or thermoelectric devices utilizing such layers). These and other aspects, features and advantages of the disclosure or of certain embodiments of the disclosure will be further understood by those skilled in the art from the following description of example embodiments. In the following description of various examples, reference is made to the accompanying drawings, which form a part hereof. It is to be understood that other modifications may be made from the specifically described methods and systems without departing from the scope of the present disclosure.

It is also to be understood that the specific materials, systems, devices and processes illustrated in the attached drawings, and/or described in the following specification, are simply example embodiments. Hence, specific dimensions and other physical characteristics relating to the embodiments disclosed herein are not to be considered as limiting. Moreover, the figures of this disclosure may represent the scale and/or dimensions according to one or more embodiments, and as such contribute to the teaching of such dimensional scaling. However, the disclosure herein is not limited to the scales, dimensions, proportions, and/or orientations shown in the figures.

Similarly, the materials and processes illustrated in the attached drawings, and described in the following specification, are simply example embodiments of the concepts defined in the appended claims. Hence, specific dimensions and other physical characteristics relating to the embodiments disclosed herein are not to be considered as limiting unless explicitly stated to be so.

In certain aspects, the disclosure relates to methods of growing epitaxial layers. This disclosure offers new implementations, which avoid the lengthy procedures and high energy consumption of thermal soaking of the substrate at a high temperature. In certain examples, the processes use kinetic energy of ionized atoms (and/or said atoms, or clusters of ejected atoms, which are envisioned within this recitation) and high flux density. The ejected atoms from molten target carry higher energy than those from the ordinary sputtering target. High energy carrying atoms can alleviate the high temperature requirement of the substrate, which is one of the traditional conditions for rhombohedral structure formation on the substrate. For example, through use of molten target sputtering ("MTS"), these processes can produce high-quality film with high energy atoms ejected from a molten target under sputtering plasma, and with the MTS system, much lower temperatures, such as less than about 500 degrees Celsius, are sufficient to grow the single crystal films, such as $Si_{1-x}Ge_x$ (x=e.g., 0.85) film because of the high kinetic energy of the atoms/clusters of atoms before reaching the substrate. Thus, in accordance with these embodiments, the energetic atoms (e.g., whether individual or in clusters) and/or clusters of atoms therefore need less additional energy for the desired lattice formation.

Moreover, in some example implementations, a very high deposition rate of the coating can be achieved in the evaporation from the molten target, as during evaporation, atoms are evolved from the target more easily and effectively than by standard sputtering processes alone because the MTS utilizes evaporation at molten state which is already in higher temperature rather than simple evaporation from solid state.

In certain prior processes, the lower energy carried by the guest atoms or clusters of atoms ejected from sputter target material was insufficient to form a modified lattice structure on a given substrate. In contrast, since novel processes of this disclosure consume less energy to eject the flux of atoms from a molten target sputtering process, the rest of sputtering plasma energy is naturally used to energize the ejected atoms or clusters of atoms departing from the target material surface. These atoms or clusters of atoms departing from the target material surface approach the substrate, e.g. a sapphire wafer, as guest atoms or clusters of atoms with high kinetic energy initially gained from molten metal sputtering process. In the conventional sputtering process, most of sputtering plasma energy is consumed to chip out or remove atoms or clusters of atoms from the target material surface, which is at a solid state. In the novel process of this disclosure, since less sputtering plasma energy is used for removing or ejecting atoms or clusters of atoms from the molten target material, the larger portion of plasma energy can be used to energize the already ejected atoms or clusters of atoms to the levels of higher kinetic energy and ionization.

In one example embodiment, since the high energy carried by the guest atoms or clusters of atoms (e.g. at least several tens of electron volts, such as about ten or more, about twenty or more, about thirty or more, or about forty or more, and so on) is sufficient for a shape change required for rhombohedral orientation of cubic structures, a single crystal formation is readily made on sapphire wafer. These processes energize the guest atoms or clusters of atoms departing from the molten target metals in the sputtering process. The guest atoms or clusters of atoms carrying with high energy impinge on the sapphire wafer and use their energy to undergo a shape change from cubic to rhombohedral structure to make a single crystal tie on trigonal structure of sapphire at much lower wafer temperature.

Thus, in certain example implementations, the epitaxy methods include ejecting atoms from a molten metal sputtering material onto a heated crystalline substrate and growing a single epitaxial layer on the substrate. The layer may be grown by tying up the ejected atoms in an orderly way with the triagonal lattice structure of substrate. The atoms may be ejected with sufficient energy that the grown epitaxial layer has a substantially rhombohedral lattice, or at least a partially rhombohedral lattice, even when the crystalline substrate is heated to a relatively lower temperature of about 800 degrees Celsius or less. In certain implementations, the crystalline substrate is heated to about 600 degrees or less, or about 500 degrees or less. In yet further embodiments, or other temperature values may be utilized, including but not limited to those as described in more detail below.

FIG. 1 illustrates an example MTS system incorporating basic components of a magnetron sputtering system, in this example a reduced-cooling of sputtering target designed for a MTS deposition. In this example, when an electric field is applied and an appropriate gas (e.g. a noble gas, such as Argon) is introduced, ionization of the gas occurs and at the same time, the ionized gas ions run along magnetic field lines with Larmor radius towards the target and bombards the target material surface. In such processes, atoms are ejected from the target. In particular, a molten target 100 is eroded by the bombarding ions and electrons released and guided by magnetic field 102 during Ar ionizations (as shown by Argon atoms 106 and ions 108) and accelerated towards the anode and substrate 110, where these also subsequently collide with additional Ar atoms, creating more ions and free electrons in the process, continuing the cycle.

Electrons 114 moving along the magnetic field path (generated by one or more magnets 116) move faster than ions and hit the target material. However, since the mass of electrons is significantly smaller than the Argon ions, the overall impact of the electrons is too small to eject atoms from the target material surface. The bombardments by ions and electrons increase the temperature of the target material.

The target may be placed on a cathode, and may include one or more metals or metallic alloys. In some examples, the cathode may include a copper plate incorporating the magnets 116, one or more water inlets and outlets for cooling, and/or with the molten target on top of the plate.

While this example utilizes Argon, other gases may be used. For example, a noble gas such neon, krypton or xenon may be used, or non-inert gases such as nitrogen or other processing gases to create nitrides or other desired compounds. These are merely examples.

In some embodiments, secondary electrons are emitted from the target surface as result of the ion bombardment and these electrons play an additive role in maintaining the plasma. The ejected target atoms 104 (and/or atom clusters) condense on a substrate 110 as a thin film 112. In this process, the atoms or clusters of atoms with higher kinetic energy and higher flux density than in conventional processes begin to bind to each other at the atomic level, forming a tightly bound atomic layer. As compared to the conventional sputter methods, the molten target material releases a higher number of high latency atoms that carry sufficient energy towards substrate for facilitating the formation of the modified crystal structure, where the crystal structure transitions from a cubic crystal to a rhombohedral crystal.

The molten target sputtering process ejects more flux of atoms from the molten target than in solid target processes where only surface atoms can be sputtered. More sources mean higher collision rate with free electrons and ions for energy transfer between the ejected atoms and the ionized Ar (or other gases) and/or electrons. The increased ionization efficiency of the magnetron may result in a dense plasma in the target region and high evaporation rate, and may eventually result in a high deposition rate at the substrate. By reducing the cooling of target materials, the target material reaches a molten state, requiring much less energy from the sputtering plasma to eject atoms. The plasma energy less spent for ejecting atoms can be transferred to the elected atoms by collision to increase the kinetic energy and latency of ejected atoms or clusters of atoms higher. As another advantage, the atom pellets puffed out of a molten target surface have high energy latency (or are energized) because the target material is already molten at an elevated temperature.

The high energy latency of sputtered atoms helps the formation of modified crystalline structure from a typical cubic or zinc-blend structure. Since the change in crystalline structure requires a certain amount of energy, the most of current practices in epitaxy growth have used an excessively heated substrate to deliver the necessary energy to impinging sputtered atoms while contacting and anchoring on substrate. Lower substrate temperatures (e.g. about 500 degrees C.) may be used with these methods' epitaxial growth, such as SiGe growth on sapphire substrate. In other examples, the principle of MTS epitaxy processes in this disclosure is applicable for more other materials although different growth conditions are required. The applications of MTS are generally for more semiconductor materials such as Group IV elements, group III-V cubic zinc-blendes, and group II-VI semiconductors. In FIG. 1, the ionized atoms or clusters of atoms are shown by the black dotted circles 104. The atomic ions are accelerated with several tens of electron volts (eV) level of energy combined by the energy transfer from the molten target and the sputtering plasma to the ejected atoms or clusters of atoms from the target sources.

These and other example MTS systems of this disclosure avoid large amounts of time and high energy consumption of thermal soaking at a high temperatures by combining the benefits of both: (1) magnetron sputtering; and (2) eased evaporation process from molten target material, however, without adding extra systems. When the flux density of atoms and clusters of atoms is increased with such systems and methods, the behavior and assembly of new atomic layers will change, adding a new parameter to epitaxial growth. This results in novel methods of modifying the film growth front, enabling beneficial and useful epitaxially-grown heterostructure devices. In particular, these methods allow use of a heated substrate, such as a sapphire, in order to form a rhombohedral structure with incident guest atoms or clusters of atoms. In certain prior systems and methods, guest atoms or clusters of atoms naturally form a cubic structure. However, in novel embodiments disclosed herein, energy carried by the guest atoms or clusters of atoms is effectively used for constructing a rhombohedral lattice instead of cubic.

In embodiments disclosed herein, the energy required for the shape change is actually provided by the high energy carrying guest atoms or clusters of atoms than by a highly heated sapphire wafer. The energy originally gained by atoms or clusters of atoms departing from the surface of molten sputtering materials is used for modifying and transforming cubic or zinc-blende structures, which are routinely formed in epitaxy formation at a low-operating temperatures, into rhombohedron on [111] orientation. These methods for growing a single crystal film can therefore generate high kinetic energy and high flux density of ionized atoms or clusters of atoms. In this process, a reasonable amount of energy from the molten target is transferred to the atoms or clusters of atoms, such as Si and Ge, ejecting from the target source and landing on the substrate. The, e.g., Si and Ge atoms or clusters of atoms modify the initial cubic structure into a rhombohedral structure while landing and forming a lattice structure on the substrate.

In short, such molten target sputtering deposition methods may be employed to grow, for example, a SiGe epitaxy single crystal film on a c-plane sapphire substrate at lower temperatures, such as about a 500 degree Celsius substrate temperature, which provides numerous advantages as described above. Among other benefits, these can provide a high film growth speed for thick film (e.g. >about 10 μm or greater than about 5 about 20 about 50 or about 100 μm) and high yield, a low substrate temperature for epitaxial growth (e.g. <about 500 degrees Celsius) which is comparable to silicon single-crystal film growth. The energetic and efficiency benefits are particularly advantageously given that low-temperature formation of single crystal semiconductor film, such as Ge or silicon-germanium ($Si_{1-x}Ge_x$), on sapphire substrate or other substrates is a key technology for the fabrication of advanced thin-film transistors.

There are even other benefits of these processes as implemented in various embodiments. For example, prior molecular beam epitaxy systems are much more expensive than the MTS systems described herein, and these also have low film growth speeds in comparison (e.g. a deposition rate of about 1.15 nm/s). Systems and methods disclosed herein have a deposition rate of about 1.5 nm/s or more, about 2.0 nm/s or more, or about 2.5 nm/s or more, In examples of the method, a high flux density of atoms or clusters of atoms (high growth rate) is possible, but the deposition rate may also be finely controlled to ensure the rhombohedron basis for single crystal formation. The deposition rate from the solid target may be controlled by the sputtering process so that the approach with the molten target mainly accelerates evaporation and improves deposition rate. This allows the deposition rate of the film deposition from the molten target to be higher than that of the film sputtered from the solid target. The atoms or clusters of atoms departing from the surface of molten magnetron target is not by a simple evaporation process but also ionized evaporation by collision process in plasma. These methods also utilize a high kinetic energy of atoms or clusters of atoms. Since the individual atom has enough energy to control eventual shape formation of lattice structure while integrating and anchoring atoms or clusters of atoms on the surface of substrate, single epitaxy layer growth with low substrate temperature is possible.

If the individual atoms or clusters of atoms do not have enough energy to deform the molecular shape or structures while reaching the substrate, the high substrate temperature will be necessary to modify the atoms or clusters of atoms shape or structure using the energy from the heated sapphire surface. The high temperature of about 900 degrees Celsius is essential for growing the single crystal $Si_{1-x}Ge_x$ on the sapphire substrate to deform the shape of the cubic or zinc-blende structure into a rhombohedron. With these methods and systems, however, less than about 500 degrees Celsius is enough to grow the single crystal $Si_{1-x}Ge_x$ film because of the high kinetic energy atoms or clusters of atoms before reaching the substrate, since these need less additional energy for the lattice formation.

In certain embodiments, this not only avoids the energy required for shape change from normal cubic or zinc-blende structure to rhombohedron from the time intensive thermal soak process of, e.g. a wafer prior to epitaxy process, but avoids other inefficiencies that result because the high amounts of thermal energy are provided by electrical heating elements. The electrical heaters cannot generate a uniform thermal field, leading to an irregular temperature profile over the substrate. The thermal soak methods by radiative or conductive heat transfer are also not effective due to the poor absorption or by uneven contact.

As mentioned above, these example methods result in an alleviation of irregular temperature pattern of substrate to grow better quality of a film. The temperature difference between the edge and the center of the substrate is relatively small since the deposition temperature required is much lower than prior methods. The temperature gradient on substrates heated above about 900 degrees Celsius can also cause deformation, which strongly affects device yield.

In sum, these methods provide a high crystalline growth, such as $Si_{1-x}Ge_x$ growth, on a substrate such as a c-plane sapphire substrate. As discussed in more detail below in reference to example materials of the disclosure, these methods provide a high composition ratio of, e.g., Ge (x=about 0.85, or about 0.50 or more, or about 0.60 or more, or about 0.70 or more, about 0.75 or more, about 0.80 or more, between about 0.75-0.85, between about 0.70-0.90, or others). The methods single crystalline film (with up to about 99.7% of the desired lattice structure), a smooth surface with high uniformity, and a high deposition rate compared with standard magnetron sputtering. Among other benefits, these methods provide the possibility of applying epitaxial growth of group IV semiconductor alloys, such as a thick $Si_{1-x}Ge_x$ film (>about 100 μm) growth for thermoelectric applications. The grown layers may also be incorporated into components or systems for high performance solar cells, MEMS devices, high efficiency thermoelectric devices, or other semiconductor devices, such as semiconductor wafers, or other thin film coating applications.

Figure 2:
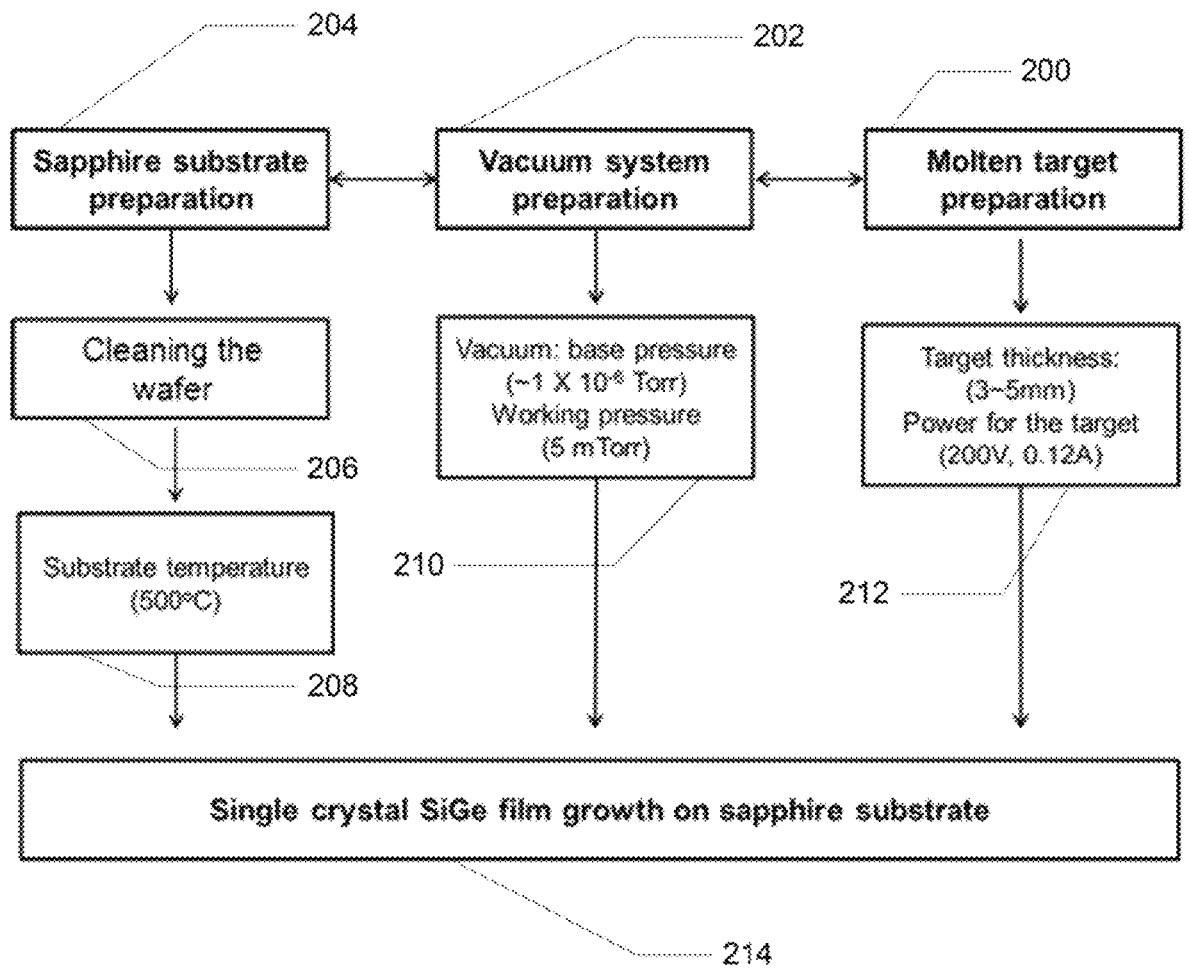
FIG. 2 is a flowchart of an example method in accordance with one or more embodiments.

FIG. 2 illustrates a flowchart of an example method of the disclosure. In this example, three phases may be performed in tandem (although they can also be ordered or staggered), where the molten target material is prepared in phase 200, the vacuum system is prepared in phase 202, and the substrate (in this example, a sapphire) is prepared in phase 204. For example, for the preparation of the substrate 204, the wafer is cleaned in step 206 and the substrate is then heated to a relatively low temperature (such as about 500 degrees Celsius or less, about 450 degrees or less, about 400 degrees of less, or about 600 degrees or less). For the vacuum system preparation, as representative examples only, a base pressure of about 0. 000001 Torr may be used, as well as, a working pressure of about 5 m-Torr, in step 210. For the molten target preparation, the target thickness may be provided at about 3-5 mm, and the power for the target may be about 200V and about 0.12 A, in step 212. Once all phases are ready, the MTS system can provide the ionization, ejection, etc. process described above to result in single crystal growth on the substrate in step 214.

A number of substrate temperatures may be used. While in advantageous examples of the methods, the crystalline substrate is heated to a temperature of about 500 degrees Celsius or less. Other temperatures may also be used however, and still provide relative benefits compared to prior art processes. For example, the substrate may be heated to about 800 degrees or less, about 700 degrees or less, about 600 degrees or less, about 550 degrees or less, about 450 degrees or less, about 475 degrees or less, or about 400 degrees or less according to the target materials selected for epitaxy. There is no single temperature of substrate that universally allows the growth of epitaxy of any selected target materials. No matter what temperature of substrate is required for the epitaxy process according to the selected target material, the disclosed MTS will definitely benefit the high quality of epitaxy, high yield, and energy saving by offering the same technical reasons discussed above.

In some examples of the method, about 50% or more, about 70% or more, about 75% or more, about 80% or more, about 85% or more, about 90% or more, about 95% or more, about 98% or more, about 99% or more, about 99.5% or more, or about 99.7% or more of the grown epitaxial layer has a rhombohedral lattice, even when utilizing these relatively lower temperatures. In other examples, the material may include smaller amounts of a rhombohedral lattice, but still have some rhombohedral orientation. In certain examples, substantially all of the grown epitaxial layer has a rhombohedral lattice.

There may be an ideal substrate temperature required to grow high quality epitaxy, based on the characteristics of the system (e.g. type of substrate) when using the disclosed MTS method. Any deviation from this substrate temperature may diminish the quality of epitaxy. When the substrate temperature is not ideal, the distinctive defects in epitaxy layers are the appearance of two different orientations of rhombohedral structures by 60 degrees of rotation. Such a twin defect, e.g. identical crystals with two different orientations within the same embodiment, appears typically when the substrate temperature is not ideal. By substrate temperature, one can observe some dominance of an orientation as compared to the other. An artful creation of twin lattice structure (TLS) within the same embodiment may offer a certain benefits for certain applications, however, may create a stacking fault where the phono transmission is scattered or reflected while keeping electrical conductivity. Thus, a range of temperature may be used, even if not the "ideal" temperature or temperature range that would substantially result in a uniform rhombohedral lattice. The amount of the rhombohedral lattice structure may be entirely or substantially made up of one orientation, while in other examples, some of the rhombohedral lattice may be in one orientation, while some may be in other orientations (e.g. about 2% or less of one orientation, about 5% or less, about 10% or less, about 20% or less, about 30% or less, about 40% or less, about 50% or less, with the remaining lattice structure in one or more distinct orientations). In some examples, however, more than about 99% of the rhombohedral lattice, or more than about 99.7%, has the same relative orientation. The partial formation of rhombohedral crystal by any amount involves several factors. A critical factor among many is the insufficient or excessive thermal energy of the ejected atom that makes a significant energy gap from the energy carried by the atom that consists of crystalline substrate material. Others include the surface irregularity of the crystalline substrate, impurities, and the intervening gas partial pressure.

In some examples of the method, the grown epitaxial layer has a thickness that is about 10 or more micrometers, about 25 or more, about 50 or more, about 75 or more, or about 100 or more micrometers, about 150 or more micrometers, or about 200 or more micrometers, or may be in the nanometer scale (e.g. tens or hundreds of nanometers, such as about 100 nanometers or more, or about 100-300 nanometers). If rhombohedral formation of cubic or zinc-blende materials on a crystalline substrate is unstable due to the mismatch of lattice constants and localization of lattice formation energy, the single epitaxial layer cannot be maintained over the thickness of layer greater than several atomic layers by the appearance of misfits, dislocations, stacking faults, lattice splits, etc. Therefore, any thickness of single epitaxial layer greater than a few tens of nanometers without any defects assures the most stable rhombohedral formation of lattice structure on a crystalline substrate. The grown epitaxial layer with the thickness of micrometer range signifies that the MTS in this disclosure works well on low temperature practice. In certain examples, the grown epitaxial layer has a thickness that is between about 10-50, about 25-75, about 75-125, about 100-150, about 100-200, about 200-300, about 250-350 or about 100-300 micrometers. The thickness of epitaxy layer may be selectively controlled by the requirement of applications. For most of CMOS application processes, the thickness of epitaxy layer is in the range from 100 nanometers to 300 nanometers. Solar cells and communication power amplifier chip-sets may have a thickness requirement or a few micrometers.

In some examples, the ejected atoms/clusters of atoms include one or more semiconductor materials, such as one or more Group IV elements. In certain embodiments, the ejected atoms include one or more of Silicon, Germanium, Carbon, and Tin. In certain examples, the crystalline substrate comprises a sapphire material or other triagonal structure of materials, such as a sapphire or Langasite ($La_3Ga_5SiO_{14}$). In certain examples, about 70% or more of the atoms of the grown epitaxial layer are Germanium, or about 75% or more, or about 80% or more, or about 85% or more. In other examples, similar amounts of another semiconductor material (e.g. Silicon or Tin or cadmium or tellurium) are used, or other even other materials noted in this disclosure such as a transition metal. In some examples, one semiconductor material, such as Germanium, is used (for example, in the amounts noted above) and substantially all of the remaining atoms are Silicon (or another single material, such as a different semiconductor material, or transition metal, in the amounts noted above). In certain examples, the atoms are ejected using ionized evaporation, as described above, and in some examples, the atoms are ejected from a surface of a molten magnetron target, as described above.

In certain examples, the substrate is cleaned prior to annealing. The substrate may also be cleaned to remove both organic and inorganic contaminants. In some examples, a sapphire wafer or other substrate is first cleaned with one or more organic solvents, such as being washed sequentially in acetone, iso-propanol, and deionized water, followed by rinsing in hot $H_2O:HCl:H_2O_2$ (in a weight ratio of about 4:4:1) and about 5% HF solution. Other amounts, materials, concentrations or ratios may also be used. Then, the wafer may be preheated by annealing at an elevated temperature, such as at about 500 degrees C. for, e.g. about 10 minutes to remove any volatile contaminants. Other time periods such as about 5 minutes, about 7 minutes, about 12 minutes, about 15 minutes, or even longer periods may be used, while shorter periods may also be appropriate depending on the characteristics (e.g. thickness and material) of the substrate. This limited heating may also modify the crystalline structure of $c-Al_2O_3$ thermally as Al layer with significant thermal activation of the substrate.

Other aspects of the disclosure relate to epitaxy materials. In some examples, the material comprises a single epitaxial layer on top of a crystalline substrate, the layer including one or more semiconductor materials, wherein the layer has a substantially rhombohedral lattice. The layered materials may be incorporated or used in various systems such as solar cells.

Figure 3:
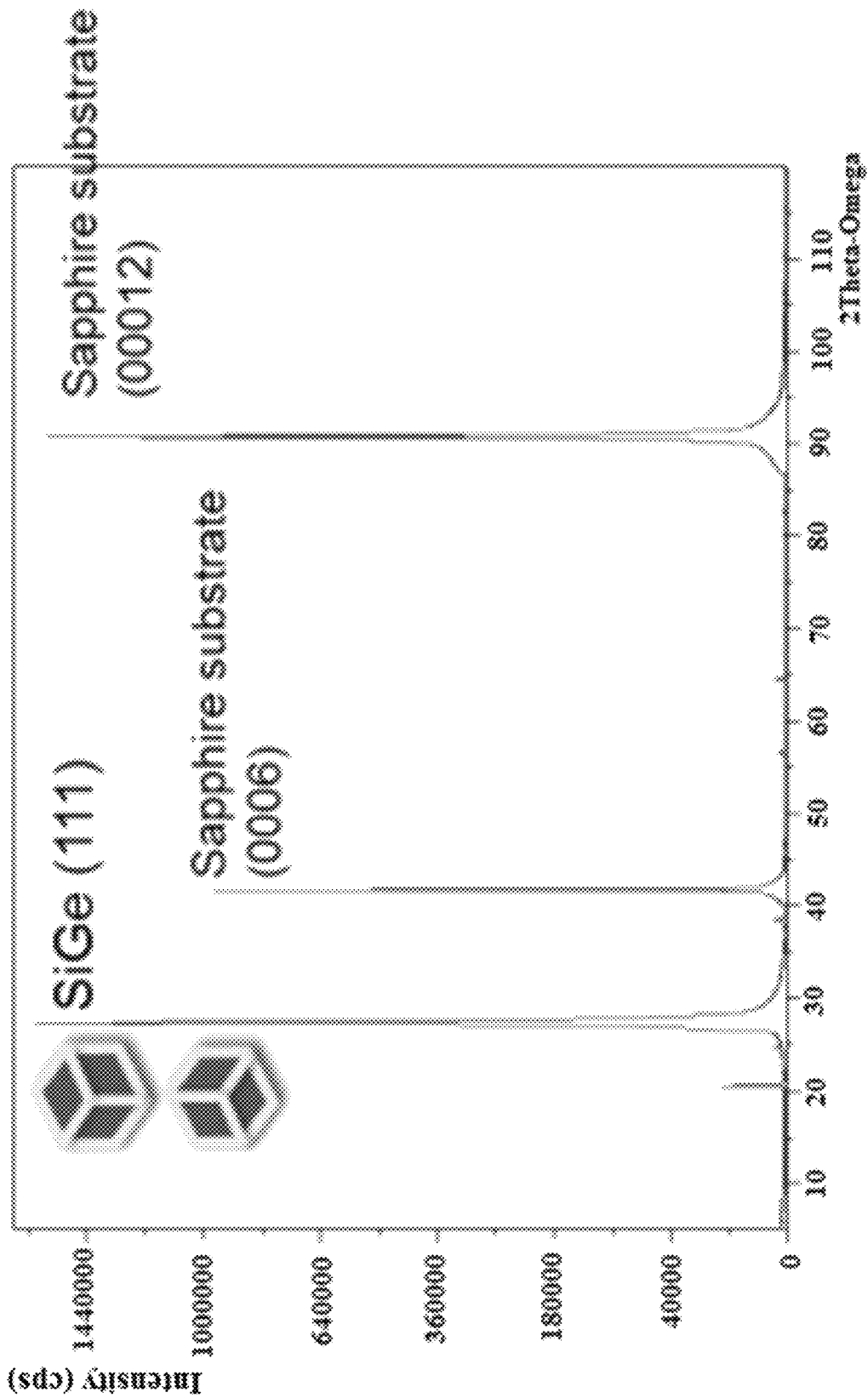
FIG. 3 provides XRD data of an example highly single crystalline (>99.7%) SiGe layers on c-plane sapphire wafer.

XRD data of an example highly single crystalline (>99.7%) SiGe layers on c-plane sapphire wafers (made via an example MTS method described above) is shown in FIGS. 3-5. A symmetric θ-2θ scan, which probed the surface normal direction of the sample, showed only the SiGe (111) reflection at 2θ~27.5 degrees along with the $Al_2O_3$(003), (006), (009), and (0012) reflections. No other SiGe reflections, such as the (220), (311), or (400), appeared in the symmetric scan, verifying that all of the crystallites were oriented in the [111] direction. The in-plane orientation of the crystallites were measured with a scan of the SiGe (220) reflections. Three strong reflections offset by 120 degrees in the scan indicated the majority in-plane orientation of the SiGe, and three small peaks indicated the 60 degrees rotated (twinned) minority in-plane orientation. The majority percentage of the SiGe crystallites can be determined by comparing the integrated areas under each peak. Single crystalline SiGe layers greater than 99.7 percent were fabricated in these growth runs according to these XRD measurements shown in these Figures.

Figure 4:
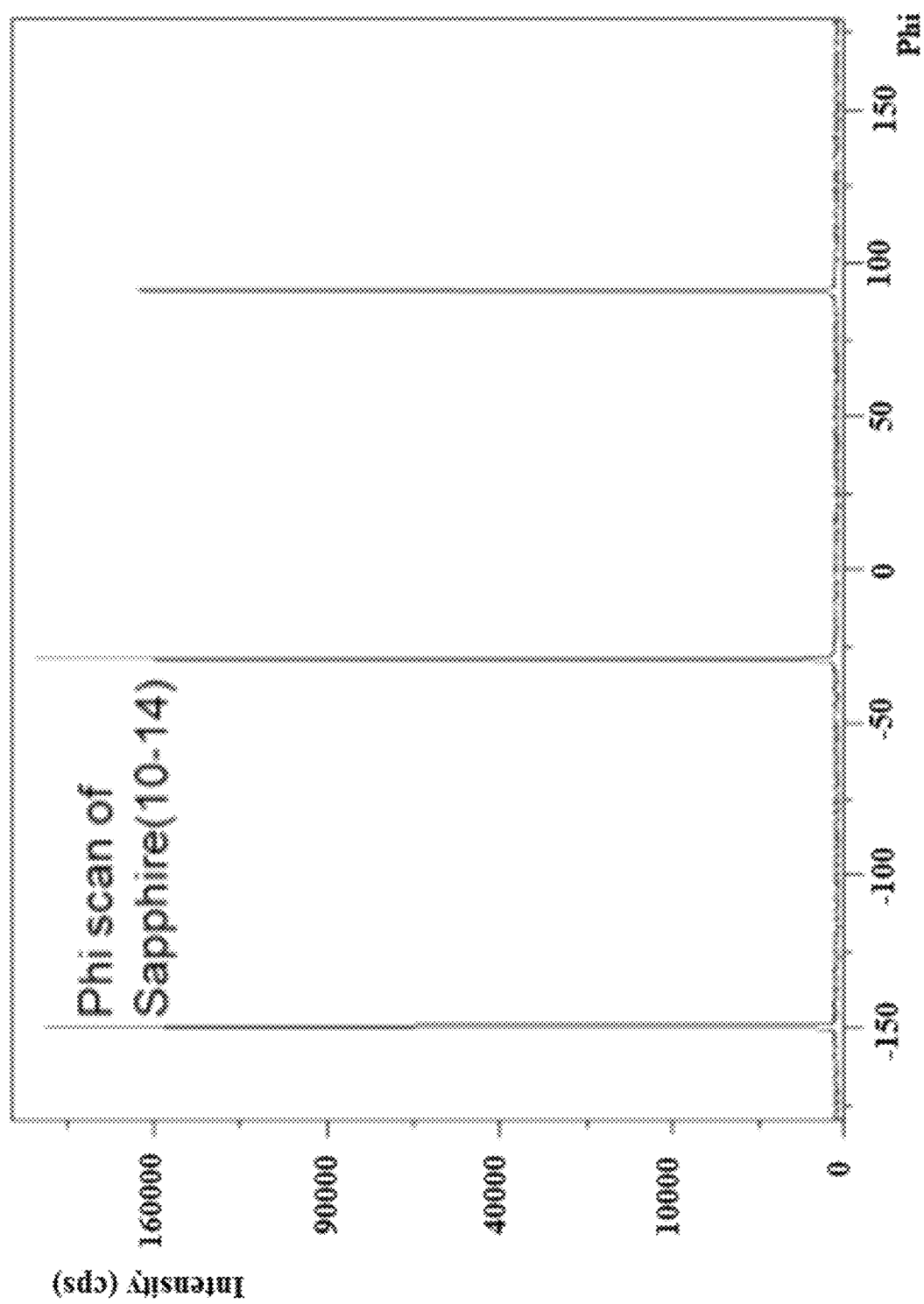
FIG. 4 provides XRD data of a sapphire material.
Figure 5:
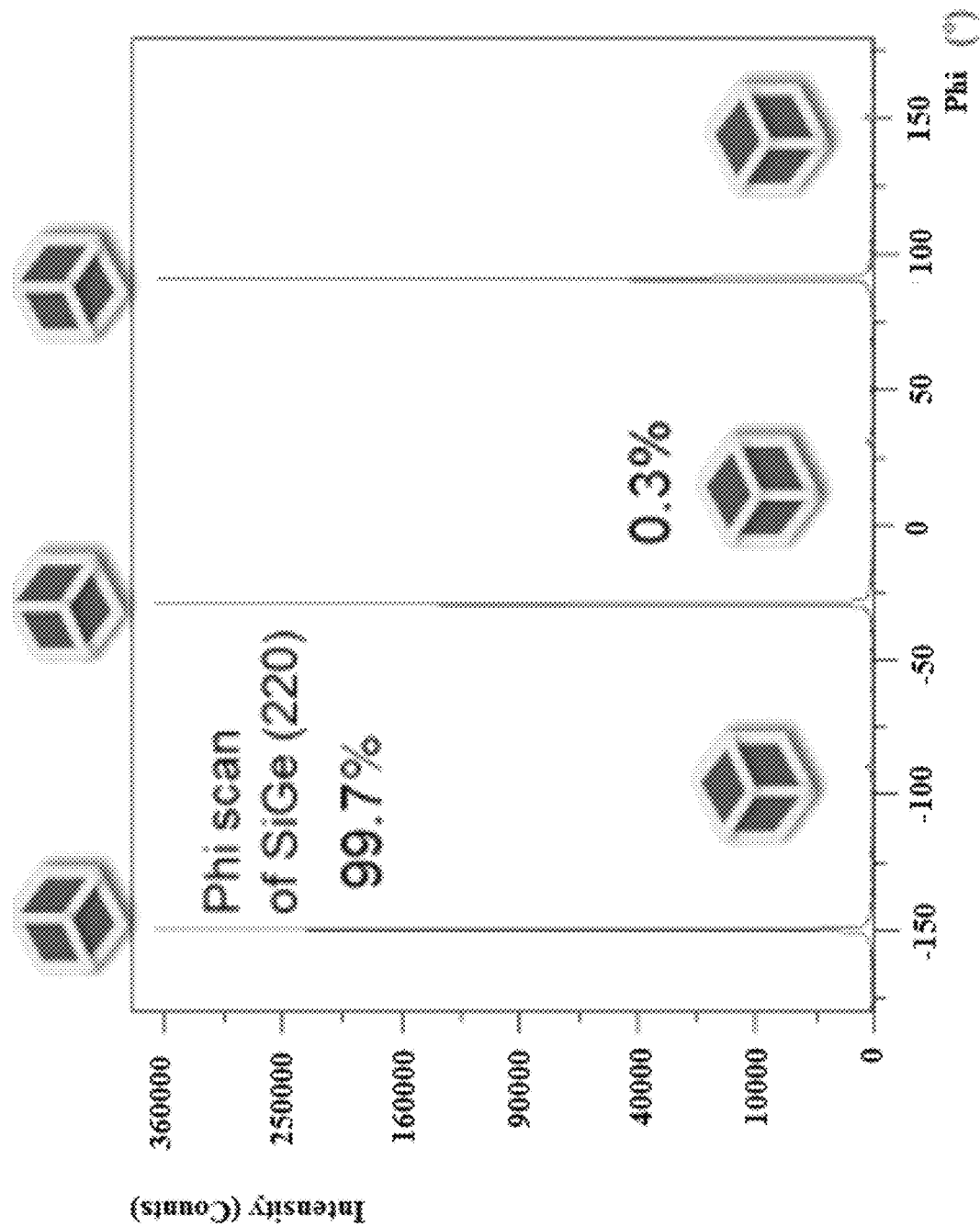
FIG. 5 provides XRD data of a SiGe material.

FIG. 4 shows data for an example sapphire (10-14) scan showing three strong reflections and FIG. 5 shows an example SiGe (220) scan with three strong reflections (offset by 120 degrees) with three small reflections rotated 60 degrees from them indicating greater than 99.7% in-plane orientation of the SiGe.

Figure 6:
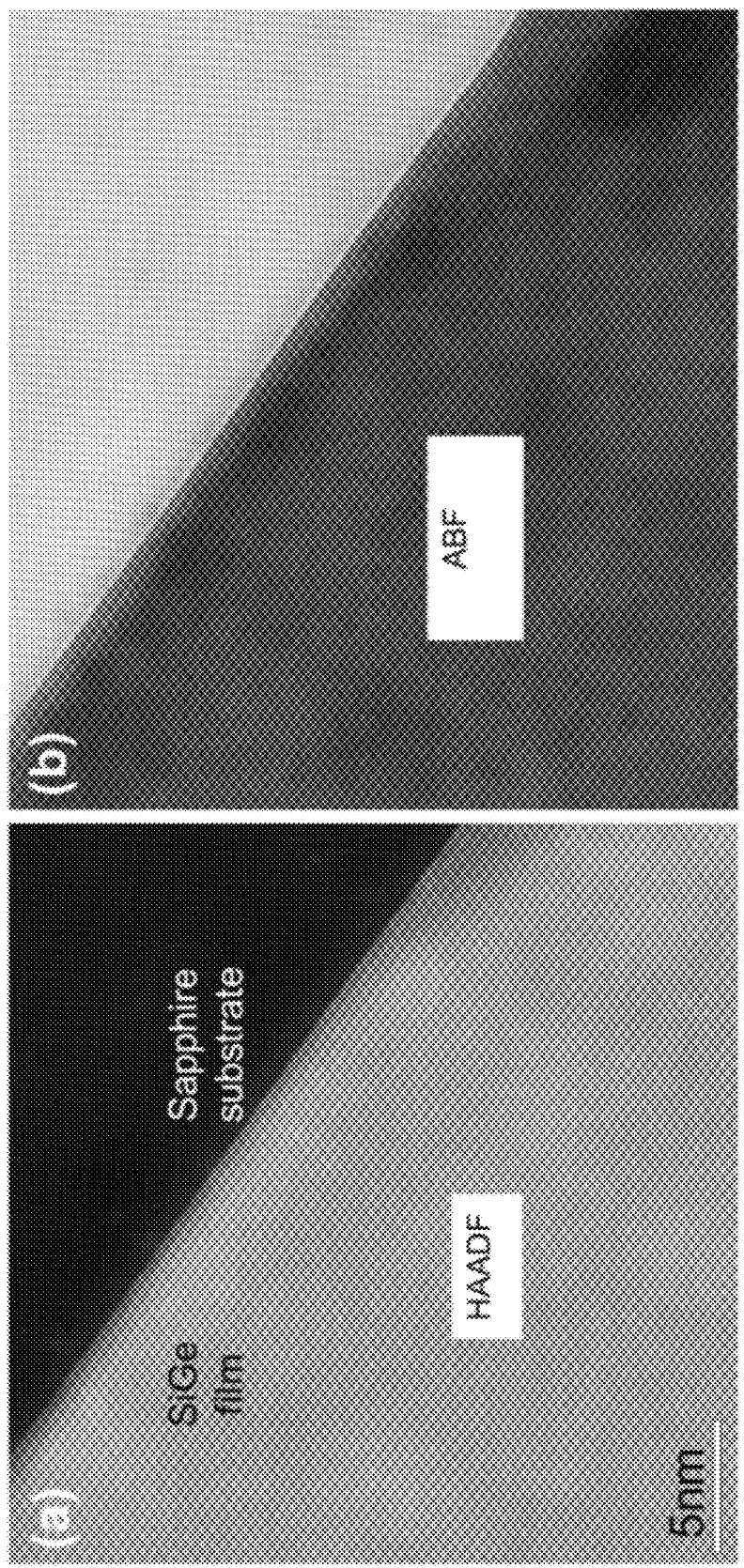
FIG. 6 provides high resolution transmission electron microscope images of an example rhombohedrally grown SiGe layer on a c-plane sapphire.

FIG. 6 provides high resolution transmission electron microscope (TEM) images of an example material that confirm an almost perfect atomic resolution lattice structure for this rhombohedrally grown SiGe on c-plane sapphire, in particular the interface. FIG. 6(*a*) provides a high-angle annular dark-field image and FIG. 6(*b*) provides an annular bright field image.

Figure 7:
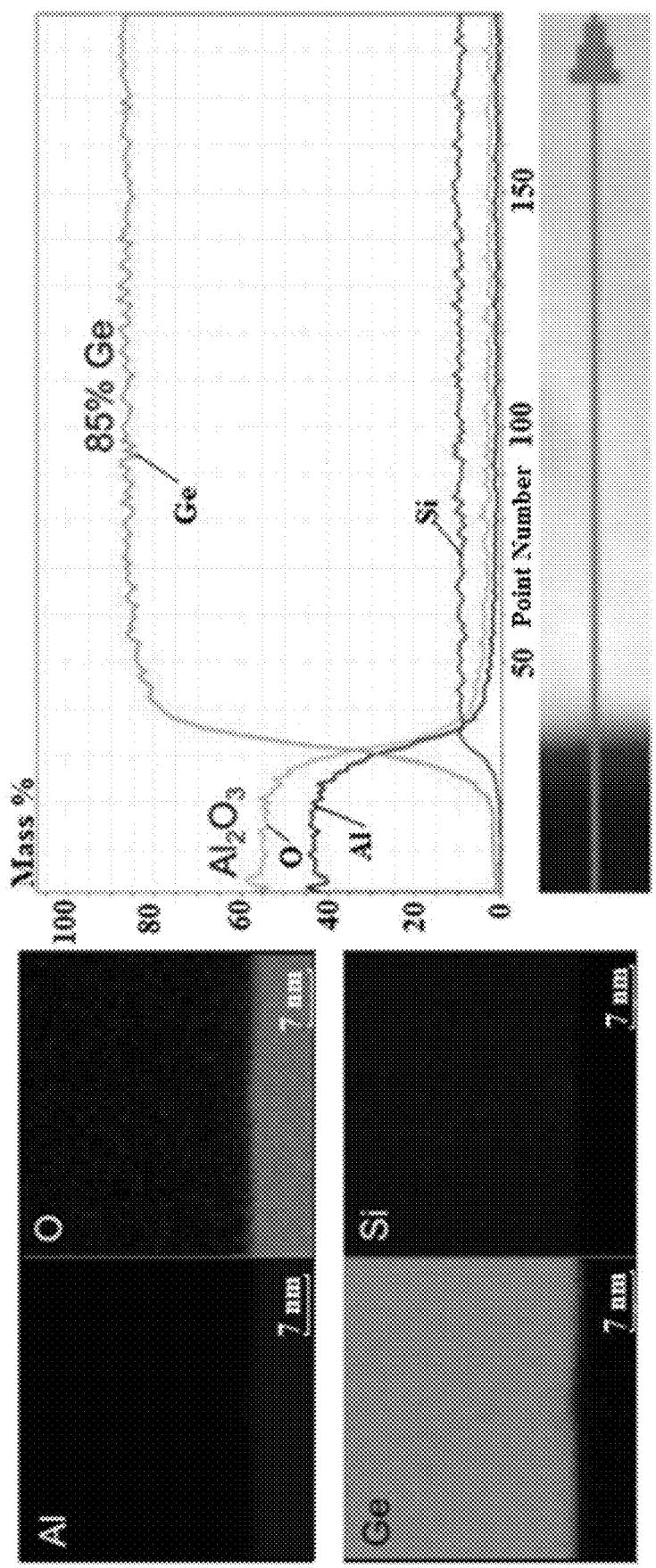
FIG. 7 provide a scanning TEM Energy Dispersive X-ray map of an example SiGe film on a sapphire substrate.

FIG. 7 illustrates a scanning TEM (STEM) Energy Dispersive X-ray (EDX) mapping of an example SiGe film on a sapphire substrate in accordance with one example embodiment. The mapping shows the Si, Ge, Al, and O elements and homogeneous SiGe with 85% Ge.

Figure 8:
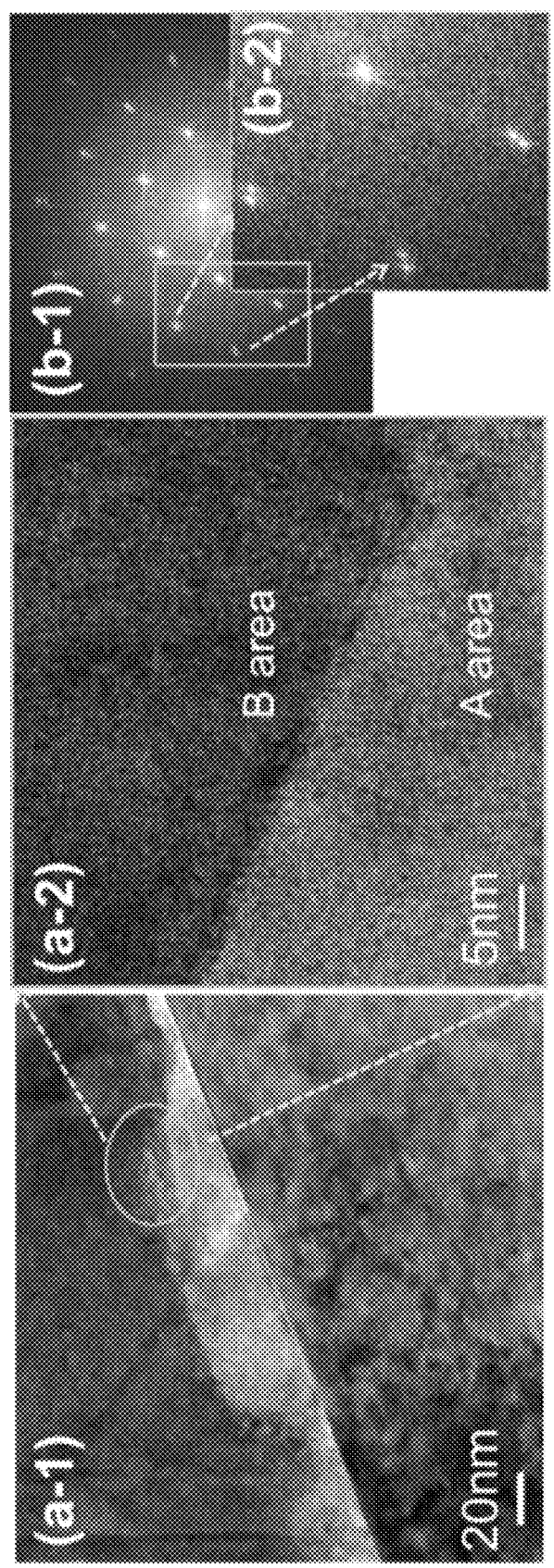
FIG. 8 provides cross-sectional TEM images at the final stage of example SiGe thin films made from a conventional magnetron-sputtering method as well as an example Molten Target Sputtering (MTS) lower temperature method of this disclosure.

FIG. 8 shows cross-sectional TEM images at the final stage of example SiGe thin films with conventional magnetron-sputtering method at 890 degrees Celsius (area A) and with an example Molten Target Sputtering (MTS) method of this disclosure at 500 degrees Celsius (B area) in accordance with one example embodiment. Both areas show the same shape of selected area diffraction pattern. However, the lattice parameter is slightly different. In particular, images (a-1) and (a-2) are at the final stage of SiGe thin film with SiGe growth as described above, while (b-1 and b-2) provide SAED (Selected Area Electron Diffraction) results of the A area and B area, and these results support the rhombohedral lattice formation model.

The attached Figures and related discussion apply to certain specific examples of the material, but other embodiments may have a variety of components and characteristics. In some examples of the material, one or more semiconductor materials of the grown layer include one or more of Silicon, Germanium, Carbon, and/or Tin. In certain embodiments, the crystalline substrate comprises a sapphire material (e.g. a wafer), or other triagonally structured crystalline materials (e.g. a wafer).

In certain examples, about 99% or more of the single epitaxial layer has a rhombohedral lattice. In some embodiments, the single epitaxial layer has a thickness that is about 10 or more micrometers, or about 100 or more micrometers. In various embodiments, the growth layer has a high Ge composition ratio (e.g. over about 50%,) such as examples where about 70% or more of the atoms of the single epitaxial layer are Germanium, or about 85% or more, and substantially all of the remaining atoms are Silicon (see amounts noted above). In some examples, the single epitaxial layer has a reduced deviation of the lattice formation, due to use of a relatively even temperature distribution of crystalline substrate under a thermal shadow.

It is to be understood that variations and modifications can be made on the aforementioned structure without departing from the concepts of the present invention, and further it is to be understood that such concepts are intended to be covered by the following claims unless these claims by their language expressly state otherwise.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

All ranges disclosed herein are inclusive of the endpoints, and the endpoints are independently combinable with each other. Each range disclosed herein constitutes a disclosure of any point or sub-range lying within the disclosed range.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." As used herein, the term "and/or" includes any and all combinations of one or more of the associated listed items. As also used herein, the term "combinations thereof" includes combinations having at least one of the associated listed items, wherein the combination can further include additional, like non-listed items. Further, the terms "first," "second," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

Reference throughout the specification to "another embodiment", "an embodiment", "exemplary embodiments", and so forth, means that a particular element (e.g., feature, structure, and/or characteristic) described in connection with the embodiment is included in at least one embodiment described herein, and can or cannot be present in other embodiments. In addition, it is to be understood that the described elements can be combined in any suitable manner in the various embodiments and are not limited to the specific combination in which they are discussed.

What is claimed is:

1. A material comprising:
    a single crystal epitaxial layer on top of a crystalline substrate, the single crystal epitaxial layer comprising one or more semiconductor materials, wherein 99% or more of the single crystal epitaxial layer has a rhombohedral lattice, wherein 99% or more of the rhombohedral lattice formed on the crystalline substrate has a [111] relative orientation, and the one or more semiconductor materials are Group IV semiconductor materials, and wherein the single crystal epitaxial layer is formed by molten target sputtering at a temperature below 600 degrees Celsius.

2. The material of claim 1, wherein the one or more semiconductor materials are selected from the group consisting of Silicon, Germanium, Carbon, and Tin.

3. The material of claim 1, wherein the crystalline substrate comprises a sapphire material.

4. The material of claim 1, wherein the crystalline substrate comprises one or more other triagonally structured crystalline materials.

5. The material of claim 1, wherein the single crystal epitaxial layer has a thickness of 10 to 300 micrometers.

6. The material of claim 1, wherein the single crystal epitaxial layer has a thickness of 100 to 300 micrometers.

7. The material of claim 6, wherein about 70% or more of the atoms of the single crystal epitaxial layer are Germanium, and at least a portion of the remaining atoms are Silicon.

8. The material of claim 7, wherein about 85% or more of the atoms of the single crystal epitaxial layer are Germanium, and at least a portion of the remaining atoms are Silicon.

9. A material comprising:
    a crystalline structure; and
    a single crystal epitaxial layer formed by molten target sputtering at a temperature of less than about 500° C., the epitaxial layer including one or more Group IV semiconductor_materials and being on the crystalline structure and having a rhombohedral lattice with at least 99.7% in-plane orientation.

10. The material of claim 9, wherein the one or more Group IV semiconductor materials includes one or more of silicon, germanium, carbon, and tin.

11. The material of claim 9, wherein the crystalline structure includes a sapphire material.

12. The material of claim 9, wherein the crystalline structure comprises one or more other trigonally structured crystalline materials.

13. The material of claim 9, wherein the single crystal epitaxial layer has a thickness of 10 to 300 micrometers.

14. The material of claim 13, wherein the single crystal epitaxial layer has a thickness of 100 to 300 micrometers.

15. The material of claim 9, wherein the single crystal epitaxial layer includes silicon atoms and at least about 70% germanium atoms.

16. The material of claim 15, wherein the single crystal epitaxial layer includes silicon atoms and at least about 85% germanium atoms.

* * * * *